(12) United States Patent
Huang et al.

(10) Patent No.: US 11,662,398 B2
(45) Date of Patent: May 30, 2023

(54) SYSTEMS AND METHODS FOR AVOIDING UNDESIRED POWER ON WHEN INFORMATION HANDLING SYSTEMS ARE STACKED

(71) Applicant: Dell Products L.P., Round Rock, TX (US)

(72) Inventors: Shao-Ku Huang, Da'an Dist. (TW); Hong-Ling Chen, Taoyuan (TW); Cheng-Hung Yang, Taipei (TW)

(73) Assignee: Dell Products L.P., Round Rock, TX (US)

( * ) Notice: Subject to any disclaimer, the term of this patent is extended or adjusted under 35 U.S.C. 154(b) by 441 days.

(21) Appl. No.: 17/028,006

(22) Filed: Sep. 22, 2020

(65) Prior Publication Data

US 2022/0091197 A1 Mar. 24, 2022

(51) Int. Cl.
*G01R 33/07* (2006.01)
*G01D 5/14* (2006.01)
*G01R 33/09* (2006.01)
*G06F 1/3215* (2019.01)
*G06F 1/16* (2006.01)
*G06F 1/3218* (2019.01)

(52) U.S. Cl.
CPC ........... *G01R 33/072* (2013.01); *G01D 5/145* (2013.01); *G01R 33/093* (2013.01); *G06F 1/1618* (2013.01); *G06F 1/3215* (2013.01); *G06F 1/1616* (2013.01); *G06F 1/1643* (2013.01); *G06F 1/1677* (2013.01); *G06F 1/3218* (2013.01)

(58) Field of Classification Search
CPC .. G01D 5/145; G01R 33/0005; G01R 33/072; G01R 33/091; G01R 33/093; G06F 1/1616; G06F 1/1618; G06F 1/1643; G06F 1/1677; G06F 1/3215; G06F 1/3218

See application file for complete search history.

(56) References Cited

U.S. PATENT DOCUMENTS

| | | | | |
|---|---|---|---|---|
| 7,428,142 | B1 * | 9/2008 | Ligtenberg | G06F 1/3203 345/157 |
| 2015/0160272 | A1 * | 6/2015 | Juds | H01H 33/027 324/244 |
| 2021/0099570 | A1 * | 4/2021 | Schenone | G06F 3/04847 |

* cited by examiner

*Primary Examiner* — Terrell S Johnson
(74) *Attorney, Agent, or Firm* — Jackson Walker L.L.P.

(57) ABSTRACT

An information handling system implemented as a convertible notebook may include a first assembly, a second assembly hingedly coupled to the first assembly, a magnet housed in the first assembly, a giant magnetoresistance sensor housed in the second assembly, a Hall effect sensor housed in the second assembly, and a management controller communicatively coupled to the giant magnetoresistance sensor and the Hall effect sensor, and configured to, based on a first signal received from the giant magnetoresistance sensor and a second signal received from the Hall effect sensor, determine a position of the first assembly relative to the second assembly.

18 Claims, 4 Drawing Sheets

SYSTEMS AND METHODS FOR AVOIDING UNDESIRED POWER ON WHEN INFORMATION HANDLING SYSTEMS ARE STACKED

TECHNICAL FIELD

The present disclosure relates in general to information handling systems, and more particularly avoiding an undesired power on event of an information handling system physically stacked upon another information handling system.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

In recent years, convertible notebooks (e.g., notebook or laptop information handling systems which are convertible to a tablet mode) have become increasingly popular for use in business and education. Often, when information technology administrators are provisioning, storing, or servicing convertible notebooks, it may be convenient to stack a plurality of such convertible notebooks 1 vertically upon one another, as shown in FIG. 1. However, for reasons described below, such stacking of existing convertible notebooks may cause one of convertible notebooks 1 to undesirably power on from a low-power state (e.g., a "sleep" or "powered off" state, sometimes referred to as "S4" or "S5"), despite such convertible notebook 1 being in a "closed" position.

To illustrate, FIG. 2 depicts an example convertible notebook 1, as is known in the art. As shown in FIG. 2, convertible notebook 1 may include a display assembly 2 and a keyboard assembly 4 rotatably coupled to one another via a hinge 6. Display assembly 2 may house therein a magnet 8, while keyboard assembly 4 may house therein a giant magnetoresistance (GMR) sensor 10 or other appropriate magnetometer. Accordingly, GMR sensor 10 may sense a magnetic field generated by magnet 8, to determine whether convertible notebook 1 is in a closed position (e.g., display assembly 2 rotated 0 degrees relative to keyboard assembly 4 such that a display of display assembly 2 and keys of keyboard assembly 4 are covered), in a notebook mode position (e.g., display assembly 2 opened more than 0 degrees relative to keyboard assembly 4, often in a position between 75 degrees and 135 degrees), or in a tablet mode position (e.g., display assembly 2 rotated 360 degrees relative to keyboard assembly 4 such that a display of display assembly 2 and keys of keyboard assembly 4 are exposed). In the closed position, convertible notebook 1 may disable its display and keyboard. In the notebook mode position, convertible notebook 1 may enable its display and keyboard. In the tablet mode position, convertible notebook 1 may enable its display and disable its keyboard.

To further illustrate, FIG. 3 depicts a cross-sectional side elevation block diagram view of a convertible notebook 1A stacked upon another convertible notebook 1B. As shown in FIG. 3, when convertible notebooks 1A and 1B are stacked in such manner, GMR sensor 8A of convertible notebook 1A may lie significantly within the magnetic fields of both magnet 8A of convertible notebook 1A and magnet 8B of convertible notebook 1B. These magnetic fields may interfere with one another, causing GMR sensor 10A to sense the combined magnetic fields of magnet 8A and 8B, rather than only the magnetic field of magnet 8A. It is possible then, that GMR sensor 10A falsely determines that convertible notebook 1A is in a notebook mode position, and may power on convertible notebook 1A (including enabling its display and keyboard), despite convertible notebook 1A being in the closed position.

SUMMARY

In accordance with the teachings of the present disclosure, one or more disadvantages and problems associated with vertically-stacked information handling systems may be reduced or eliminated.

In accordance with embodiments of the present disclosure, an information handling system implemented as a convertible notebook may include a first assembly, a second assembly hingedly coupled to the first assembly, a magnet housed in the first assembly, a giant magnetoresistance sensor housed in the second assembly, a Hall effect sensor housed in the second assembly, and a management controller communicatively coupled to the giant magnetoresistance sensor and the Hall effect sensor, and configured to, based on a first signal received from the giant magnetoresistance sensor and a second signal received from the Hall effect sensor, determine a position of the first assembly relative to the second assembly.

In accordance with these and other embodiments of the present disclosure, a method may be provided for use in an information handling system implemented as a convertible notebook having a first assembly with a magnet housed therein and a second assembly hingedly coupled to the first assembly. The method may include receiving a first signal from a giant magnetoresistance sensor housed in the second assembly, receiving a second signal from a Hall effect sensor housed in the second assembly, and based on the first signal and the second signal, determining a position of the first assembly relative to the second assembly.

In accordance with these and other embodiments of the present disclosure, an article of manufacture may include a non-transitory computer readable medium and computer-executable instructions carried on the computer readable medium, the instructions readable by a processor, the instructions, when read and executed, for causing the processor to, in an information handling system implemented as a convertible notebook having a first assembly with a magnet housed therein and a second assembly hingedly coupled to the first assembly: receive a first signal from a giant magnetoresistance sensor housed in the second assembly; receive a second signal from a Hall effect sensor housed in the second assembly; and based on the first signal and the second signal, determine a position of the first assembly relative to the second assembly.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
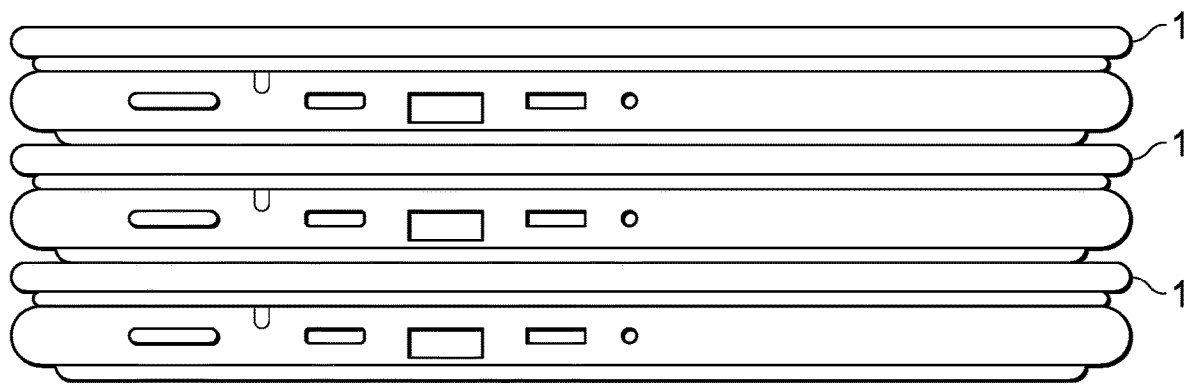
FIG. 1 illustrates a plurality of convertible notebooks stacked vertically upon one another, as is known in the art.
Figure 2:
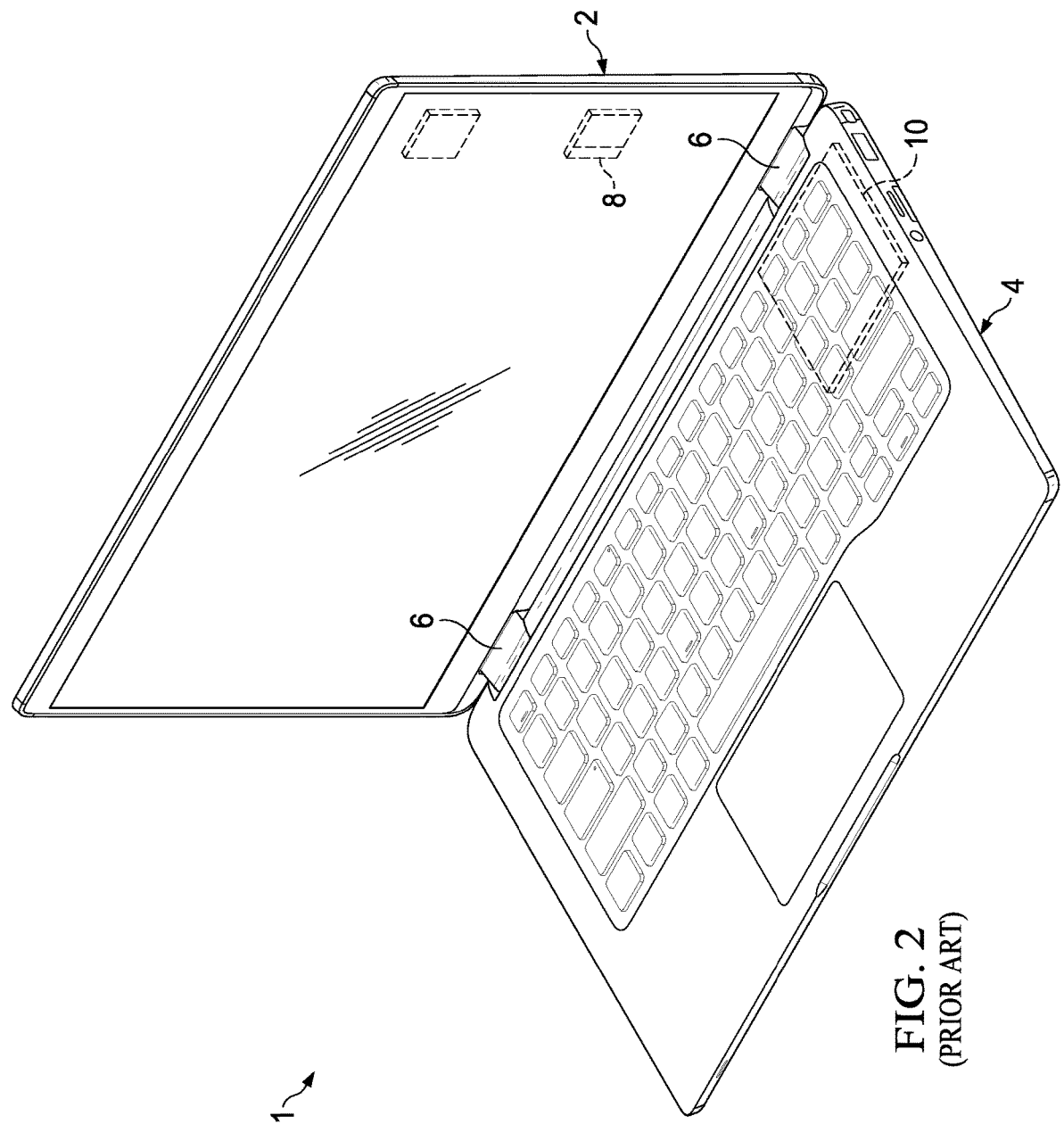
FIG. 2 illustrates an example convertible notebook, as is known in the art.
Figure 3:
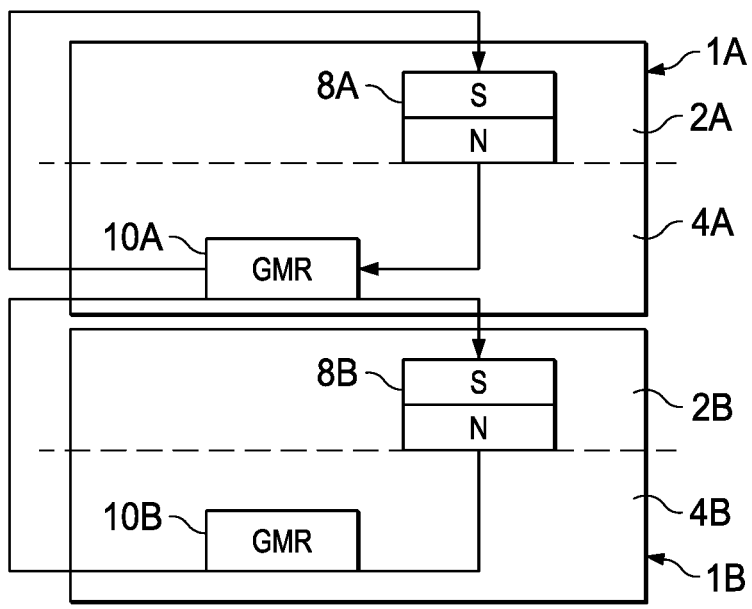
FIG. 3 illustrates a cross-sectional side elevation block diagram view of a convertible notebook vertically stacked upon another convertible notebook, as is known in the art.

Preferred embodiments and their advantages are best understood by reference to FIGS. 4-7, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a personal digital assistant (PDA), a consumer electronic device, a network storage device, or any other suitable device and may vary in size, shape, performance, functionality, and price. The information handling system may include memory, one or more processing resources such as a central processing unit ("CPU") or hardware or software control logic. Additional components of the information handling system may include one or more storage devices, one or more communications ports for communicating with external devices as well as various input/output ("I/O") devices, such as a keyboard, a mouse, and a video display. The information handling system may also include one or more buses operable to transmit communication between the various hardware components.

For the purposes of this disclosure, computer-readable media may include any instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory; as well as communications media such as wires, optical fibers, microwaves, radio waves, and other electromagnetic and/or optical carriers; and/or any combination of the foregoing.

For the purposes of this disclosure, information handling resources may broadly refer to any component system, device or apparatus of an information handling system, including without limitation processors, service processors, basic input/output systems (BIOSs), buses, memories, I/O devices and/or interfaces, storage resources, network interfaces, motherboards, and/or any other components and/or elements of an information handling system.

For the purposes of this disclosure, the terms "wireless transmissions" and "wireless communication" may be used to refer to all types of electromagnetic communications which do not require a wire, cable, or other types of conduits. Examples of wireless transmissions which may be used include, but are not limited to, short-range wireless communication technologies (e.g., proximity card, Radio-Frequency Identification (RFID), Near Field Communication (NFC), Bluetooth, ISO 14443, ISO 15693, or other suitable standard), personal area networks (PAN) (e.g., Bluetooth), local area networks (LAN), wide area networks (WAN), narrowband personal communications services (PCS), mobile telephony technologies, broadband PCS, circuit-switched cellular, cellular digital packet data (CDPD), and radio frequencies, such as the 800 MHz, 900 MHz, 1.9 GHz and 2.4 GHz bands, infra-red and laser.

Figure 4:
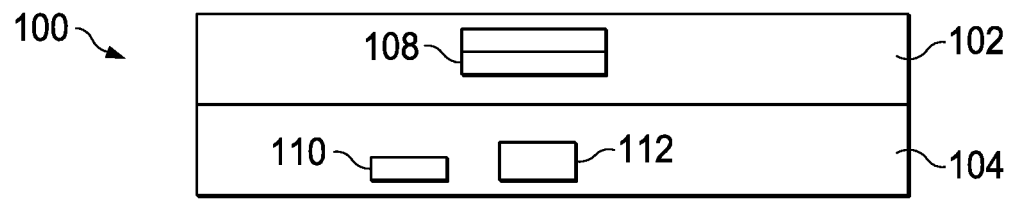
FIG. 4 illustrates a cross-sectional side elevation block diagram view of selected components of a convertible notebook, in accordance with embodiments of the present disclosure.

FIG. 4 illustrates a cross-sectional side elevation block diagram view of selected components of a convertible notebook 100, in accordance with embodiments of the present disclosure. As shown in FIG. 4, convertible notebook 100 may include a display assembly 102 (which may house display and/or other information handling resources) and a keyboard assembly 104 (which may house a keyboard, pointing device, and/or other information handling resources) hingedly coupled via one or more hinges. Each of display assembly 102 and keyboard assembly 104 may be integral parts of an enclosure for convertible notebook 100. Each of display assembly 102 and keyboard assembly 104 may have an enclosure made from one or more suitable materials, including without limitation plastic, steel, and/or aluminum.

In operation, convertible notebook 100 may be translated between a closed position (e.g., a position of display assembly 102 relative to keyboard assembly 104 such that display assembly 102 substantially overlays keyboard assembly 104, or vice versa) and a notebook mode position (e.g., a position of display assembly 102 relative to keyboard assembly 104 such that display assembly 102 does not substantially overlay keyboard assembly 104, or vice versa, such as when the angle formed by display assembly 102 and keyboard assembly 104 at the hinge coupling display assembly 102 and keyboard assembly 104 is substantially non-zero). In some embodiments, a user may be able to open convertible notebook 100 into a tablet mode position, by rotating display assembly 102 relative to keyboard assembly 104 beyond an angle of 180 degrees relative to the closed position, and up to 360 degrees.

As further shown in FIG. 4, display assembly 102 may house a magnet 108. Magnet 108 may comprise any suitable material or object that produces a magnetic field.

Also as shown in FIG. 4, keyboard assembly 104 may house a GMR sensor 110 and a Hall effect sensor 112. GMR sensor 110 may comprise any suitable magnetometer configured to measure a quantum mechanical magnetoresistance effect associated with magnet 108. Accordingly, in the absence of an external magnetic field that interferes with the magnetic field of magnet 108, GMR sensor 110 may sense a magnetic field generated by magnet 108, and based on such sensed magnetic field, determine a position of magnet 108. In particular in accordance with the present disclosure, GMR sensor 110 may, when convertible notebook 100 is in the tablet mode position (e.g., opened 360 degrees or approximate thereto), generate a signal indicating that convertible notebook 100 is in the tablet mode position.

Hall effect sensor 112 may comprise any suitable device, system, or apparatus configured to measure a magnitude of a magnetic field. In accordance with embodiments of the present disclosure, Hall effect sensor 112 may be placed within keyboard assembly 104 such that when convertible notebook 100 is in the closed position, Hall effect sensor 112 is proximate to magnet 108.

Figure 5:
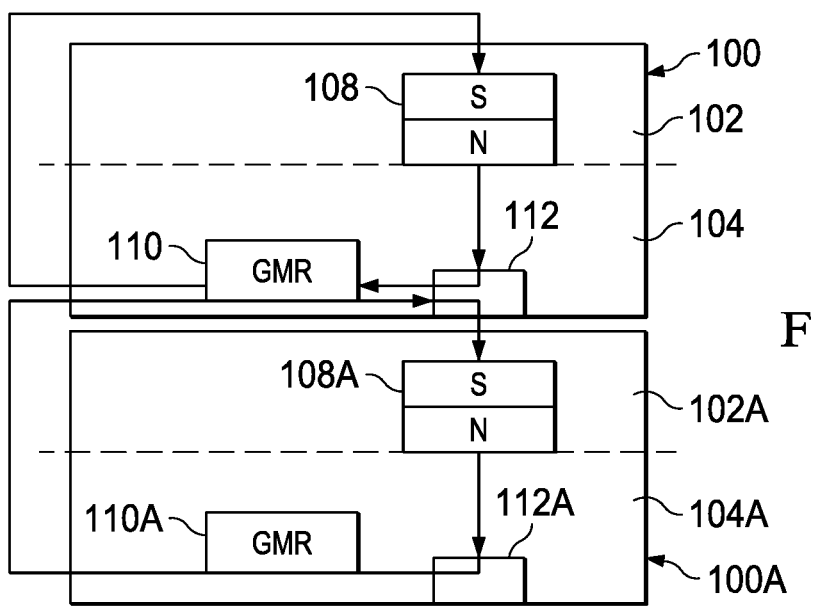
FIG. 5 illustrates a cross-sectional side elevation block diagram view of selected components of a convertible notebook vertically stacked upon another convertible notebook, in accordance with embodiments of the present disclosure.

Accordingly, as shown in FIG. 5, if convertible notebook 100 is vertically stacked upon another similar convertible notebook 100A also having a magnet 108A, the magnetic fields of magnet 108 and magnet 108A may add together in magnitude, such that Hall effect sensor 112 may detect a stronger magnetic field when convertible notebook 100 is vertically stacked upon another similar convertible notebook 100A than when convertible notebook 100 is not vertically stacked upon another similar convertible notebook 100A. Thus, by sensing a magnitude of the magnetic field, Hall effect sensor 112 may be able to determine whether convertible notebook 100 is vertically stacked upon another similar convertible notebook 100A. Further, based on its orientation related to magnet 108, Hall effect sensor 112 may generate a signal indicative of whether or not convertible notebook 100 has been opened up from either of its closed position or its tablet mode position.

Although convertible notebook 100 is shown in FIG. 4 as having certain components (e.g., display assembly 102, keyboard assembly 104, etc.), convertible notebook 100 may include any other suitable components which may not have been depicted in FIG. 4 for the purposes of clarity and exposition.

Figure 6:
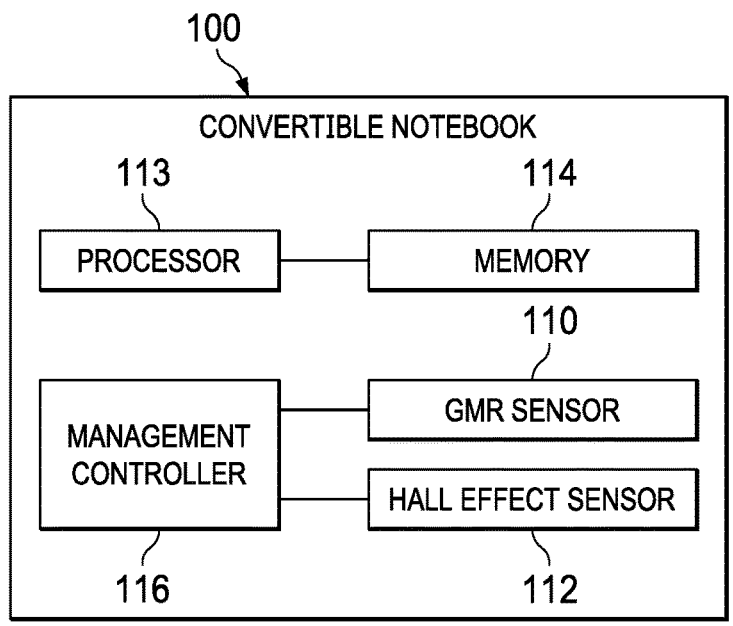
FIG. 6 illustrates a block diagram of selected components of an example information handling system, in accordance with certain embodiments of the present disclosure.

FIG. 6 illustrates a block diagram of selected components of example convertible notebook 100, in accordance with certain embodiments of the present disclosure. As depicted in FIG. 6, convertible notebook 100 may include a processor 113, a memory 114 communicatively coupled to processor 113, and a management controller 116 communicatively coupled to processor 113.

Processor 113 may include any system, device, or apparatus configured to interpret and/or execute program instructions and/or process data, and may include, without limitation, a microprocessor, microcontroller, digital signal processor (DSP), application specific integrated circuit (ASIC), or any other digital or analog circuitry configured to interpret and/or execute program instructions and/or process data. In some embodiments, processor 113 may interpret and/or execute program instructions and/or process data stored in memory 114, storage resource, and/or another component of convertible notebook 100.

Memory 114 may include any system, device, or apparatus configured to retain data (including program instructions) for a period of time (e.g., computer-readable media). Memory 114 may include RAM, EEPROM, a PCMCIA card, flash memory, magnetic storage, opto-magnetic storage, or any suitable selection and/or array of volatile or non-volatile memory that retains data after power to convertible notebook 100 is turned off.

Management controller 116 may be configured to provide out-of-band management facilities for management of convertible notebook 100. Such management may be made by management controller 112 even if convertible notebook 100 is powered off or powered to a standby state. In certain embodiments, management controller 116 may include or may be an integral part of a baseboard management controller (BMC), a remote access controller (e.g., a Dell Remote Access Controller or Integrated Dell Remote Access Controller), or an enclosure controller. In other embodiments, management controller 116 may include or may be an integral part of a chassis management controller (CMC). In yet other embodiments, management controller 116 may include or may be an integral part of an embedded controller (EC).

In operation, management controller 116 may receive a signal from GMR sensor 110 (e.g., indicating whether convertible notebook 100 is in its tablet mode position) and a signal from Hall effect sensor 112 (e.g., indicating a magnitude of a magnetic field sensed by Hall effect sensor 112), and based on such two signals, determine a position of convertible notebook 100 (e.g., closed position, notebook mode position, or tablet mode position).

Figure 7:
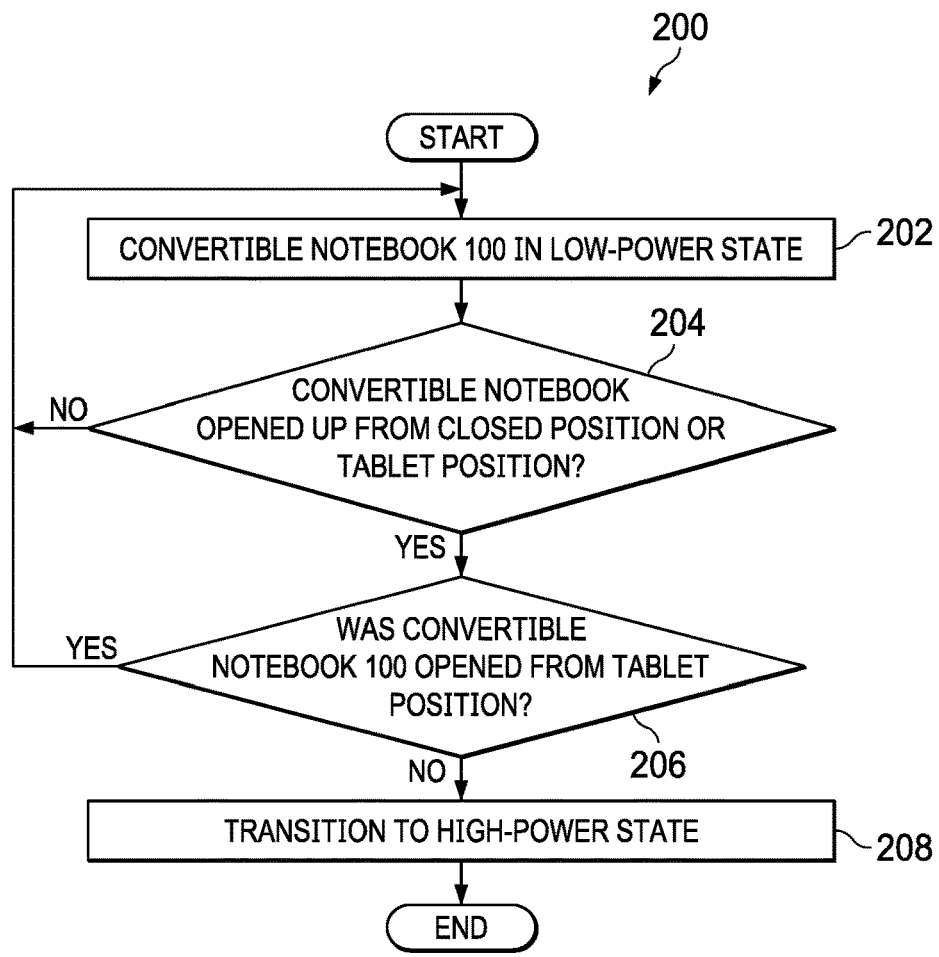
FIG. 7 illustrates a flow chart for an example method of determining a position of a convertible notebook, in accordance with embodiments of the present disclosure.

FIG. 7 illustrates a flow chart for an example method 200 of determining a position of a convertible notebook, in accordance with embodiments of the present disclosure. According to one embodiment, method 200 may begin at step 202. As noted above, teachings of the present disclosure may be implemented in a variety of configurations of information handling system 102.

At step 202, convertible notebook 100 may be in a low-power state (e.g., powered down or in sleep state, such as states known as "S4" or "S5"). At step 204, management controller 116 may determine if a signal from Hall effect sensor 112 indicates that convertible notebook 100 has been opened up from either of its closed position or its tablet mode position to a notebook mode position. If the signal from Hall effect sensor 112 indicates that convertible notebook 100 has been opened up from either of its closed position or its tablet mode position to a notebook mode position, method 200 may proceed to step 206. Otherwise, method 200 may proceed again to step 202, and convertible notebook 100 may remain in the low-power state.

At step 206, management controller 116 may determine if a signal from GMR sensor 110 indicates that, at the time Hall effect sensor 112 indicated that convertible notebook 100 has been opened up from the closed or tablet mode position, whether convertible notebook 100 was opened from the tablet position. If management controller 116 indicates that convertible notebook 100 was opened from the tablet position, method 200 may proceed again to step 202, and convertible notebook 100 may remain in the low-power state. Otherwise, method 200 may proceed to step 208.

At step 208, management controller 116 may determine that convertible notebook 100 was opened from its closed position based on the signals from GMR sensor 110 and Hall effect sensor 112, and accordingly may cause convertible notebook 100 to enter a high-power state (e.g., power on, wake up, or enter "S0" state). After completion of step 208, method 200 may end.

Although FIG. 7 discloses a particular number of steps to be taken with respect to method 200, method 200 may be executed with greater or lesser steps than those depicted in FIG. 7. In addition, although FIG. 7 discloses a certain order of steps to be taken with respect to method 200, the steps comprising method 200 may be completed in any suitable order.

Method 200 may be implemented using an information handling system implemented as convertible notebook 100 or any other system operable to implement method 200. In certain embodiments, method 200 may be implemented partially or fully in software and/or firmware embodied in computer-readable media.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described above, the principles of the present disclosure may be implemented using any number of techniques, whether currently known or not. The present disclosure should in no way be limited to the exemplary implementations and techniques illustrated in the figures and described above.

Unless otherwise specifically noted, articles depicted in the figures are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. An information handling system implemented as a convertible notebook, comprising:
    a first assembly;
    a second assembly hingedly coupled to the first assembly;
    a magnet housed in the first assembly;
    a giant magnetoresistance sensor housed in the second assembly;
    a Hall effect sensor housed in the second assembly; and
    a management controller communicatively coupled to the giant magnetoresistance sensor and the Hall effect sensor, and configured to, based on a first signal received from the giant magnetoresistance sensor and a second signal received from the Hall effect sensor, determine a position of the first assembly relative to the second assembly.

2. The information handling system of claim 1, wherein:
    the first assembly comprises a display assembly comprising a display device; and
    the second assembly comprises a keyboard assembly comprising a keyboard.

3. The information handling system of claim 1, wherein the position is one of a closed position, a notebook mode position, or a tablet mode position.

4. The information handling system of claim 1, wherein the management controller is further configured to set a power state of the information handling system based on the position.

5. The information handling system of claim 1, wherein the Hall effect sensor generates the second signal to indicate whether the information handling system has been opened from either of a closed position or a tablet mode position to a notebook mode position.

6. The information handling system of claim 1, wherein the giant magnetoresistance sensor generates the first signal to indicate whether the information handling system has been opened from a tablet mode position.

7. A method, for use in an information handling system implemented as a convertible notebook having a first assembly with a magnet housed therein and a second assembly hingedly coupled to the first assembly, the method comprising:
    receiving a first signal from a giant magnetoresistance sensor housed in the second assembly;
    receiving a second signal from a Hall effect sensor housed in the second assembly; and
    based on the first signal and the second signal, determining a position of the first assembly relative to the second assembly.

8. The method of claim 7, wherein:
the first assembly comprises a display assembly comprising a display device; and
the second assembly comprises a keyboard assembly comprising a keyboard.

9. The method of claim 7, wherein the position is one of a closed position, a notebook mode position, or a tablet mode position.

10. The method of claim 7, further comprising setting a power state of the information handling system based on the position.

11. The method of claim 7, wherein the Hall effect sensor generates the second signal to indicate whether the information handling system has been opened from either of a closed position or a tablet mode position to a notebook mode position.

12. The method of claim 7, wherein the giant magnetoresistance sensor generates the first signal to indicate whether the information handling system has been opened from a tablet mode position.

13. An article of manufacture, comprising;
a non-transitory computer readable medium; and
computer-executable instructions carried on the computer readable medium, the instructions readable by a processor, the instructions, when read and executed, for causing the processor to, in an information handling system implemented as a convertible notebook having a first assembly with a magnet housed therein and a second assembly hingedly coupled to the first assembly:
receive a first signal from a giant magnetoresistance sensor housed in the second assembly;
receive a second signal from a Hall effect sensor housed in the second assembly; and
based on the first signal and the second signal, determine a position of the first assembly relative to the second assembly.

14. The article of claim 13, wherein:
the first assembly comprises a display assembly comprising a display device; and
the second assembly comprises a keyboard assembly comprising a keyboard.

15. The article of claim 13, wherein the position is one of a closed position, a notebook mode position, or a tablet mode position.

16. The article of claim 13, the instructions for further causing the processor to set a power state of the information handling system based on the position.

17. The article of claim 13, wherein the Hall effect sensor generates the second signal to indicate whether the information handling system has been opened from either of a closed position or a tablet mode position to a notebook mode position.

18. The article of claim 13, wherein the giant magnetoresistance sensor generates the first signal to indicate whether the information handling system has been opened from a tablet mode position.

* * * * *